(12) United States Patent
Loibl et al.

(10) Patent No.: US 6,239,370 B1
(45) Date of Patent: May 29, 2001

(54) ELECTRICAL LINE PENETRATION THROUGH A HOUSING WALL

(75) Inventors: Josef Loibl, Regen; Ulf Scheuerer; Frank Franzen, both of Regensburg, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/161,197

(22) Filed: Sep. 24, 1998

(30) Foreign Application Priority Data

Sep. 24, 1997 (DE) ................................................ 197 42 178

(51) Int. Cl.$^7$ ........................................................ H02G 3/16
(52) U.S. Cl. ...................... 174/65 R; 174/50; 174/50.61; 174/50.62; 174/151
(58) Field of Search ................................ 174/65 R, 50, 174/50.58, 50.61, 50.62

(56) References Cited

U.S. PATENT DOCUMENTS

| | | | | |
|---|---|---|---|---|
| 769,646 | * | 9/1904 | Case .................................... | 174/65 R |
| 3,260,786 | * | 7/1966 | Katzschner .......................... | 174/65 R |
| 4,842,551 | * | 6/1989 | Heimann ............................. | 174/58 X |
| 5,118,458 | * | 6/1992 | Nishihara et al. ................... | 264/155 |
| 5,227,587 | * | 7/1993 | Paterek ................................ | 174/65 R |
| 5,243,130 | * | 9/1993 | Kitagawa ............................. | 174/50 |
| 5,399,807 | * | 3/1995 | Yarbrough et al. ................. | 174/65 R |
| 5,491,300 | | 2/1996 | Huppenthal et al. .............. | 174/65 R |
| 5,679,926 | * | 10/1997 | Maloney et al. .................... | 174/65 R |
| 5,821,011 | * | 10/1998 | Taylor et al. ....................... | 174/50 X |
| 5,979,043 | * | 11/1999 | Baker et al. ......................... | 29/830 |

FOREIGN PATENT DOCUMENTS

| | | |
|---|---|---|
| 19517455A1 | 11/1996 | (DE) . |
| 0 448 876 A2 | 10/1991 | (EP) . |
| 0513263B1 | 11/1992 | (EP) . |
| 0 668 147 A2 | 8/1995 | (EP) . |
| 2 290 420 | 12/1995 | (GB) . |

* cited by examiner

Primary Examiner—Dean A. Reichard
Assistant Examiner—Angel R. Estrada
(74) Attorney, Agent, or Firm—Herbert L. Lerner; Laurence A. Greenberg; Werner H. Stemer (57) ABSTRACT

An electrical line penetration through a housing wall made of plastic has electrical traces embedded in a flexible conductor. The electrical traces of the flexible conductor have electrical contact points on both sides of the housing wall. The flexible circuit is injection-molded into the housing wall. In the production of the sealed electrical line penetration, a flexible film with an electrical trace is clamped in, on the outer side of the housing to be injection-molded and the inner side of the housing to be injection-molded respectively, between two halves of an injection mold.

8 Claims, 9 Drawing Sheets

ELECTRICAL LINE PENETRATION THROUGH A HOUSING WALL

BACKGROUND OF THE INVENTION

1. Field of the Invention

The invention pertains to the field of electrical connections between two mutually sealed environments. In particular, the invention relates to a sealed electrical line penetration through a housing wall made of plastic and to a method of producing a sealed electrical line penetration.

Motor vehicles increasingly require control electronics to be integrated in the engine or transmission. For this purpose, the control electronics that are mounted on a circuit carrier must be shielded from the oils used in engines and transmissions, because the oils contain chemically extremely aggressive additives. At the same time, however, electrical lines must be led through the shielding to allow components of an engine or a transmission to be electronically controlled.

Electrical line penetration assemblies of the type described herein may also be referred to as penetrators or conductor lead-throughs.

2. Description of the Related Art

A connector system that is suitable for use in the adverse automotive conditions is known from European patent EP 0 513 263 B1. There, a flexible film with electrical traces is led through between a closure part and a housing and establishes an electrical connection between a component in the interior of the housing and a component outside the housing. To accomplish sealing between the flexible film and the closure part or the housing, the flexible film must be surrounded by a seal. The sealing of the closure part with respect to the housing and the flexible film is relatively complex. In addition, the closure part and the housing must be fastened to each other in a defined way in order to bring about reliable sealing.

German published patent application DE 195 17 455 A1 discloses a gastight penetration for a conductor through a fastening part made of plastic, in which a shrink-fit tube is adhesively attached onto the conductor. The shrink-fit tube enters into a bond with the plastic of the fastening part. If a multiplicity of conductors are to be led through the fastening part, a multiplicity of conductors must be provided with shrink-fit tubes and fixed so they can be encapsulated in plastic. On account of being encapsulated in plastic, producing very high temperatures, the conductor has no insulation directly outside the housing. On account of the soft and elastic properties of a shrink-fit tube, a liquid-tight insulation cannot be accomplished.

U.S. Pat. No. 5,491,300 describes a penetrator housing through which flexible circuits (flat cable conductors) connect to a liquid-cooled supercomputer. The penetrator housing is fitted into the housing of the supercomputer.

SUMMARY OF THE INVENTION

It is accordingly an object of the invention to provide a line penetration through a housing wall, which overcomes the disadvantages of the heretofore-known devices and methods of this general type and which provides for a simple, yet particularly reliable, sealed electrical line penetration through a housing wall.

With the foregoing and other objects in view there is provided, in accordance with the invention, a sealed electrical line penetration through a housing wall made of plastic, comprising:

a flexible circuit penetrating the housing wall, the flexible circuit having a plurality of electrical traces embedded therein and electrical contact points on either side of the housing wall;

the flexible circuit being encapsulated by the housing wall, and the electrical traces of the flexible circuit being led to different levels in the housing wall.

In accordance with an added feature of the invention, the flexible circuit is a flexible film with a top film and a base film, the electrical traces being embedded between the top film and the base film.

In accordance with an additional feature of the invention, the top film and the base film are physically and/or chemically bonded to the housing wall.

In accordance with another feature of the invention, the flexible circuit is one of a plurality of flexible circuits molded into the housing wall and split up in the housing wall to different levels. With the above and other objects in view there is also provided, in accordance with the invention, a sealed electrical line penetration, comprising:

a housing with a housing wall made of plastic;

a flexible circuit penetrating the housing wall, the flexible circuit having a plurality of electrical traces embedded therein and electrical contact points on either side of the housing wall;

the flexible circuit being encapsulated by the housing wall, and the flexible circuit being molded into the housing substantially around a periphery thereof.

There is also provided, in accordance with the invention, a method of producing a sealed electrical line penetration through a housing wall of a plastic housing. The method comprises the following steps:

providing a flexible film with an electrical trace;

placing the flexible film between two halves of an injection mold and fixing the flexible film relative to the mold on an inner side and an outer side respectively of a housing wall to be injection-molded in the injection mold; and injection-molding a plastic housing with the housing wall.

In accordance with yet another feature of the invention, the flexible film has a given melting point temperature, and the injection-molding step comprises injection-molding the plastic housing at a temperature above the melting point temperature of the flexible film.

In accordance with a concomitant feature of the invention, prior to the injection-molding step, the flexible film is encapsulated in plastic in a region lying within the housing wall after the injection-molding step.

In other words, the production of the electrical line penetration through the housing wall is already integrated into the process of producing the plastic housing wall. Apart from the injection-molding of the housing wall, no additional production steps are necessary in order to bring about an electrical connection through the housing wall and accomplish the seal between a conductor and the housing wall or between two halves of the housing wall. According to the invention, a seal-tightness with respect to liquids used in engines and transmissions, such as oil and gasoline, can be achieved particularly reliably. This is significant if the electrical line penetration connects control electronics integrated into an automatic transmission and encapsulated with respect to the transmission oil to components lying outside the encapsulation, such as connectors, sensors or actuators. If a leak were to develop in the connection over a period of time, the control electronics would be destroyed by penetration of the oil. The transmission would have to be removed to renew the control electronics, thus causing considerable costs.

It is particularly advantageous that the electrical traces to be led through the housing wall can be split up in the housing wall. For this purpose, the electrical traces merely have to be fixed with respect to the inner side and the outer side respectively of the housing wall to be injection-molded. The path followed by the traces or the flexible films within the housing wall to be injection-molded is of no significance.

Other features which are considered as characteristic for the invention are set forth in the appended claims.

Although the invention is illustrated and described herein as embodied in an electrical line penetration through a housing wall, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
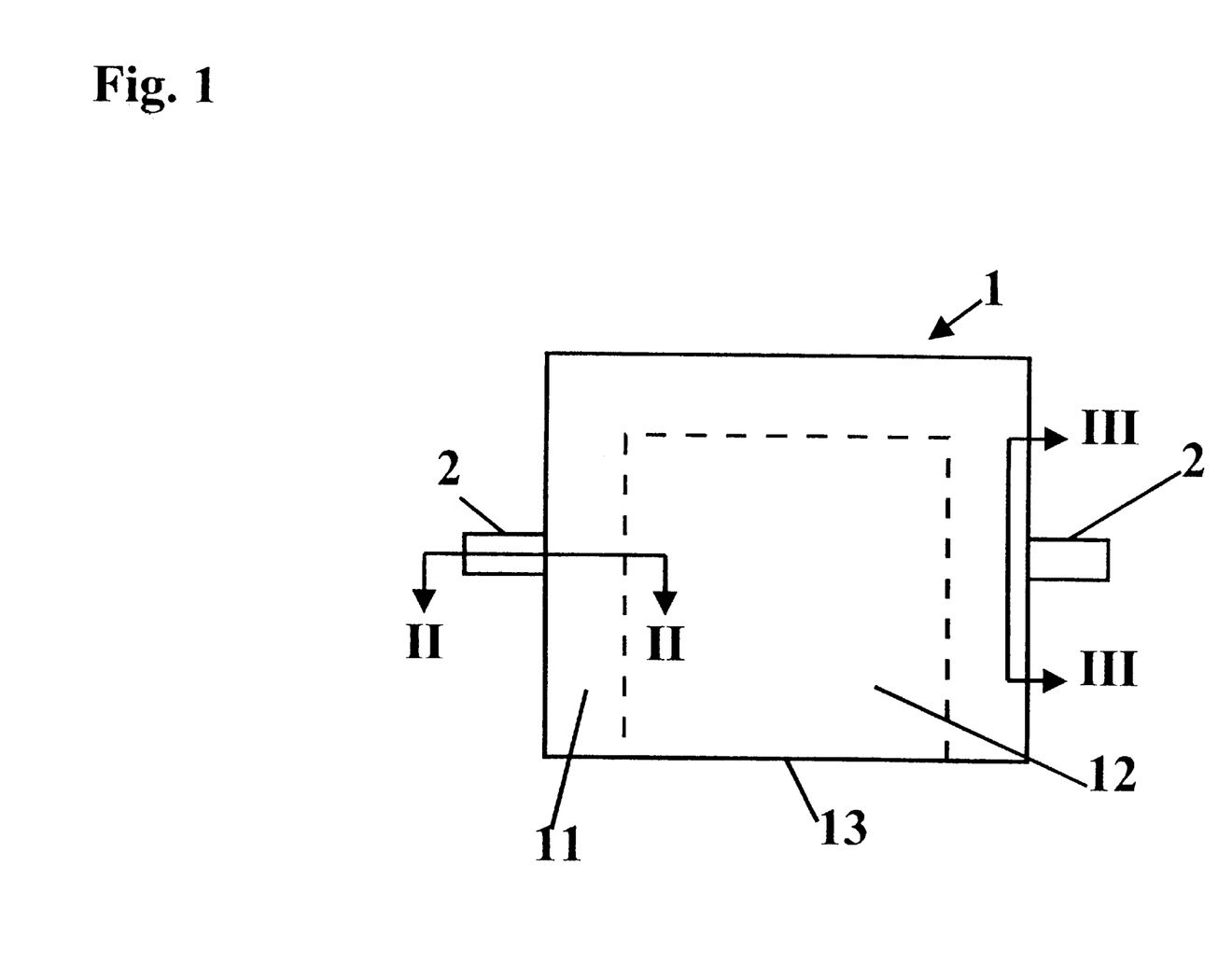
FIG. 1 is a diagrammatic front view of a housing, through the left-hand and right-hand walls of which a flexible circuit penetrates.

Referring now to the figures of the drawing in detail and first, particularly, to FIG. 1 thereof, there is seen a plastic housing 1 with a housing wall 11, which encloses a cavity 12. The housing is accessible from below through a housing opening 13. Two flexible circuits 2 (flat conductors) have been injection molded into the housing wall 11 on opposite sides of the housing. Alternatively, a single continuous flexible circuit may also achieve the same purpose as the two flexible circuits.

Figure 2:
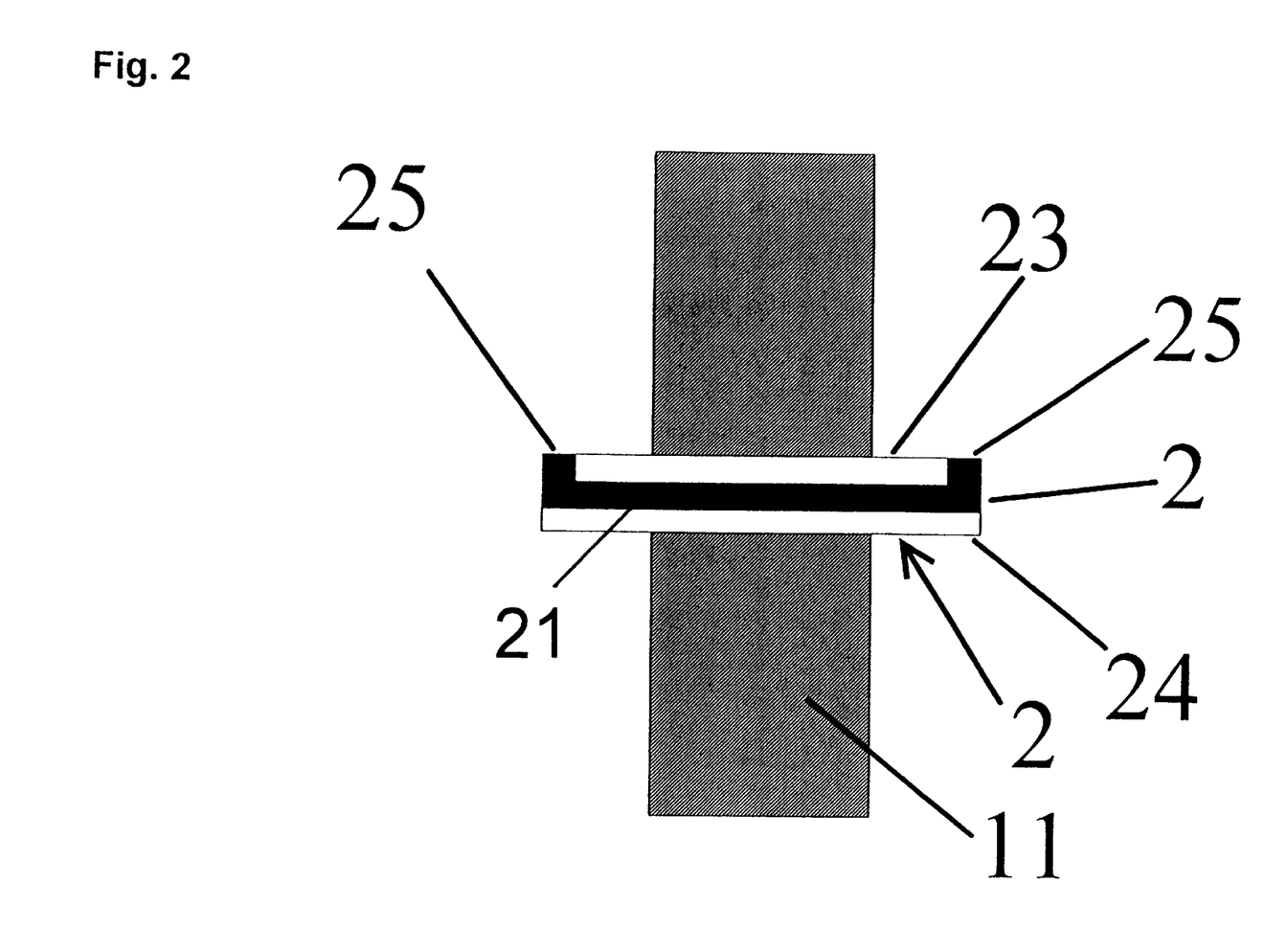
FIG. 2 is a section in the plane II—II of FIG. 1.

The section represented in FIG. 2, in the plane II—II through FIG. 1, illustrates the path of the flexible circuit 2 through the housing wall 11. An electrical trace 21 of the flexible circuit is covered by a top film 23 and a base film 24. Both the top film 23 and the base film 24 consist of polyimide. The flexible circuit has contact points 25 or pads on both sides of the housing wall 11. At the contact points 25, an electrical connection to electronic components or circuits is established.

Figure 3:
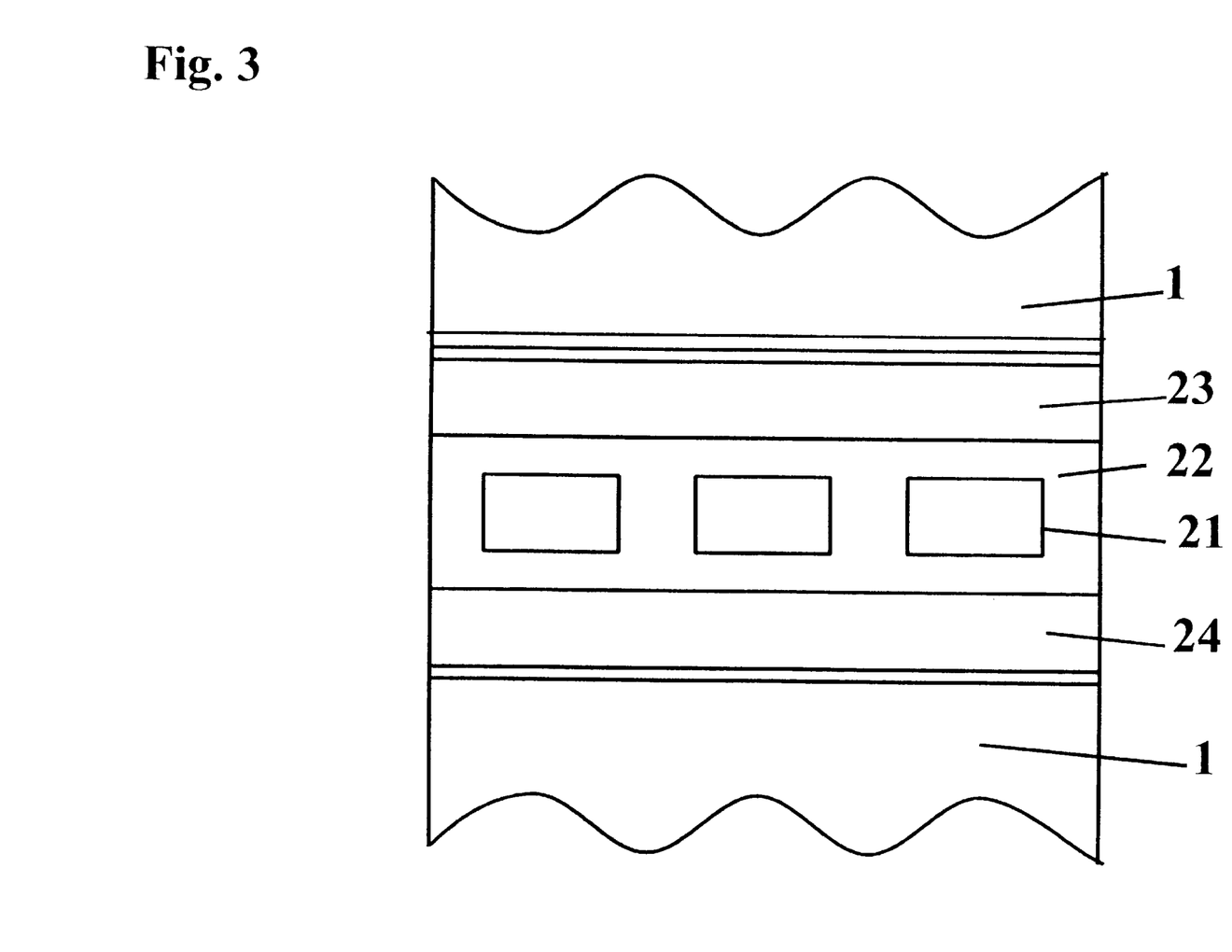
FIG. 3 is a partial sectional view taken in the plane III—III of FIG. 1.

FIG. 3 shows a section turned through 90° with respect to FIG. 2 through the housing wall 11. This makes it clear that the flexible circuit 2 accommodates a plurality of electrical traces 21. The electrical traces are embedded between the top film 23 and the base film 24 in an adhesive 22.

During the injection-molding of the plastic housing, a kind of fusing process takes place between the plastic of the housing wall 11 and the plastic of the top film 23 and of the base film 24 if the melting temperatures of the base film and top film are below the temperature of the injected plastic.

Depending on the choice of temperature and material, a fusing, welding or intimate flowing together of the materials of the flexible circuit and the housing can be brought about. This produces a physical and/or chemical bond between the plastics of the flexible circuit and of the housing wall.

A fiber-reinforced polyamide, for example, is suitable as the oil-resistant plastic for the housing wall. On account of the incipient or full bonding between the flexible circuit 2 and the housing wall 11, an absolutely oil-tight and temperature-resistant penetration of the flexible circuit 2 through the housing wall 11 is produced. This seal-tightness is not adversely affected even by the cooling of the housing wall after the injection-molding or by temperature changes during later use in a transmission or the like.

Figure 4:
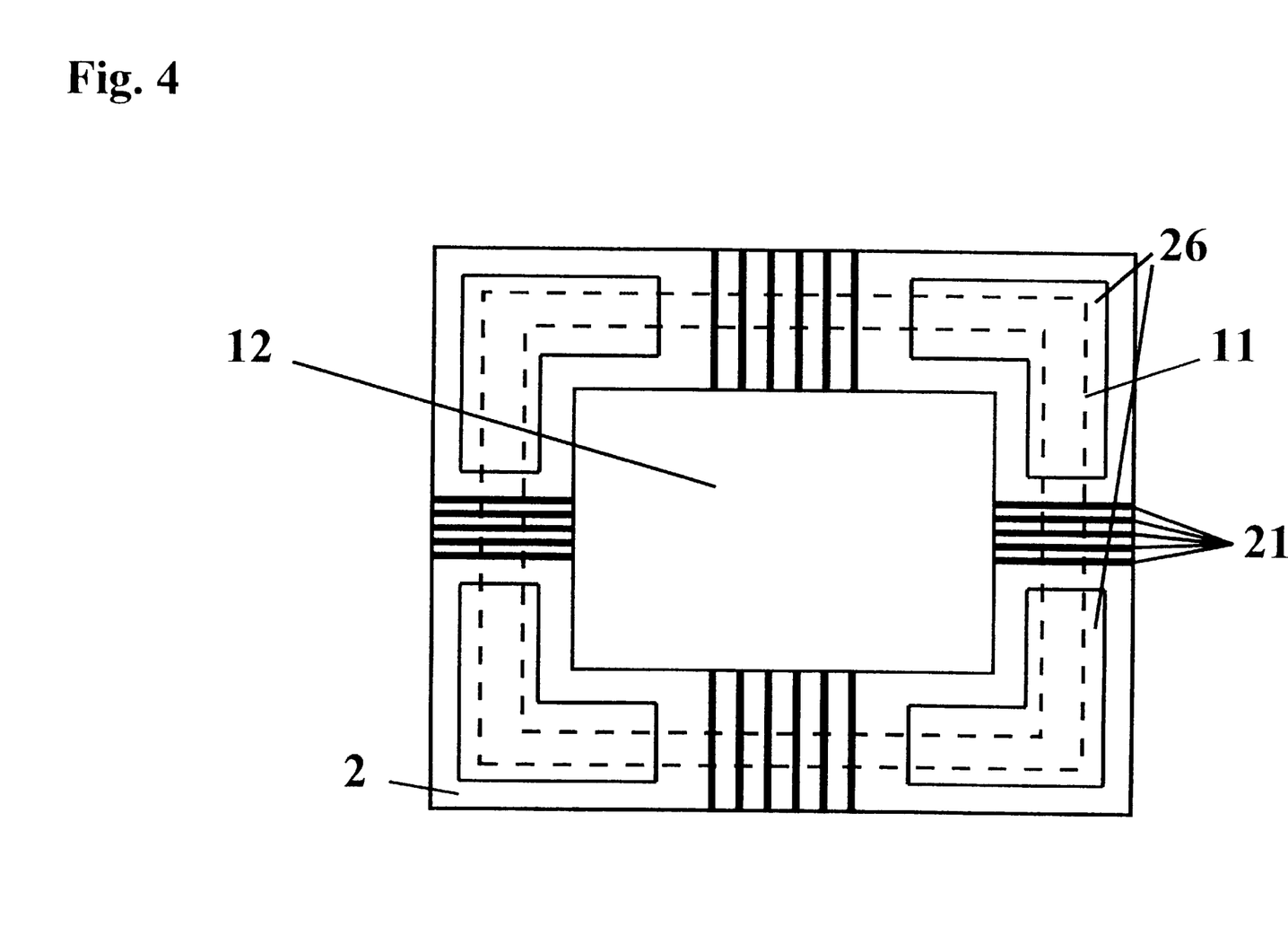
FIG. 4 is a bottom plan view of a plastic housing with a flexible circuit molded in essentially around the periphery.

The view of a housing from below represented in FIG. 4 shows a flexible circuit 2 molded in essentially around the periphery over the entire cross section of the housing wall 11. The flexible circuit has clearances 26 through which plastic can flow during the injection-molding. As a result, a bond is produced between a lower part and an upper part of the housing.

In the interior of the housing, a circuit carrier, in particular an LTCC substrate (Low Temperature Cofired Ceramics), may be adhesively attached onto the flexible circuit 2 by an electrically conductive contact adhesive for establishing an electrical connection between the contact points 25 of the flexible circuit 2 and the corresponding contact points of the circuit carrier.

Such a circuit carrier is attached beforehand to a metal plate by a thermally conductive adhesive. The metal plate with the circuit carrier is then led through the housing opening 13, in order to establish an electrical connection between the circuit carrier on the metal plate, preferably a plate made of aluminum, and the flexible circuit 2. The metal plate may serve at the same time for closing the housing opening 13 with respect to the outside.

Figure 5:
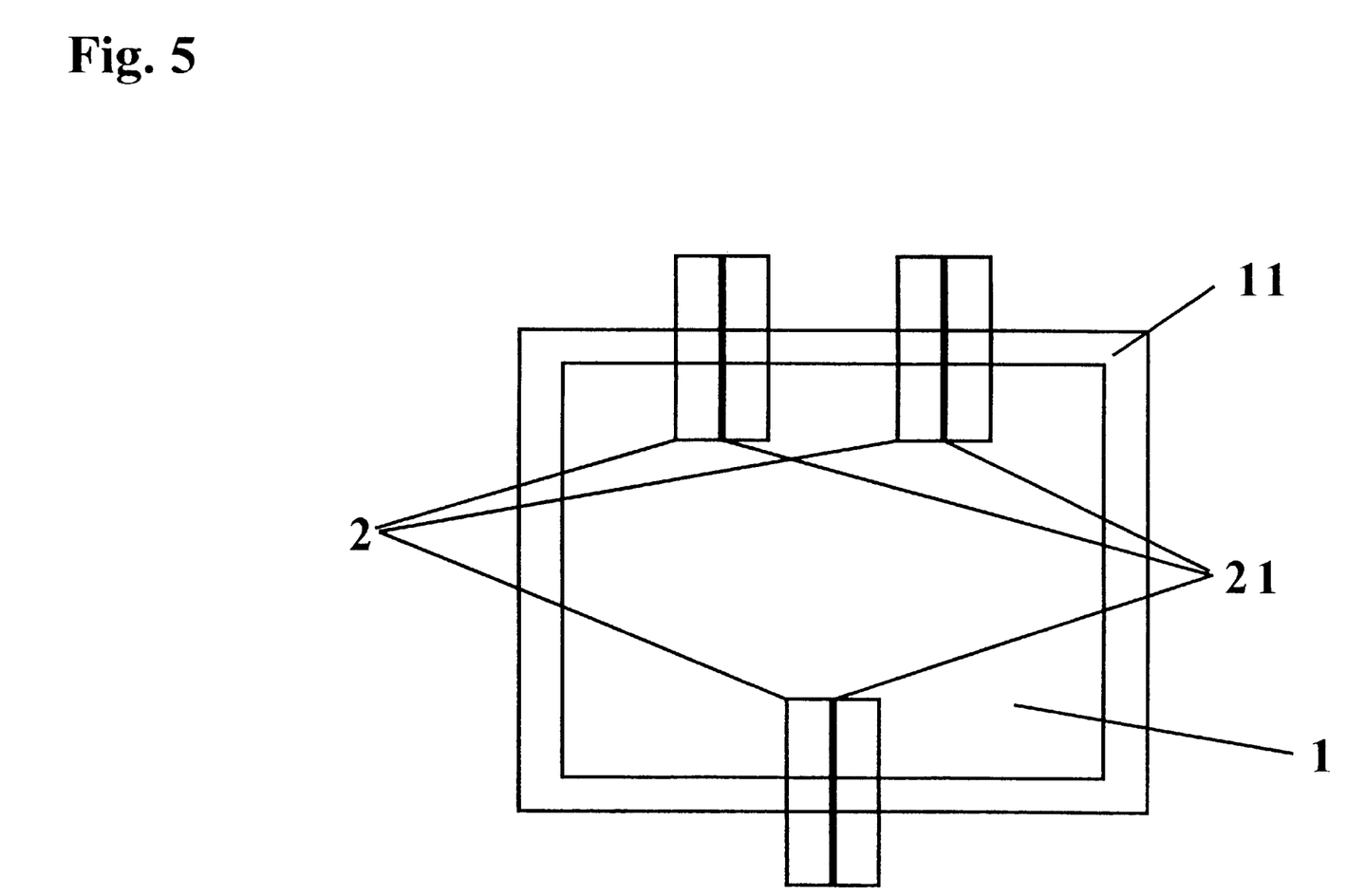
FIG. 5 is a bottom plan view of a plastic housing with three molded-in flexible circuits.

As shown in FIG. 5, electrical traces 21, surrounded by a flexible circuit 2, can be molded into the housing wall 11 at any points.

Figure 6:
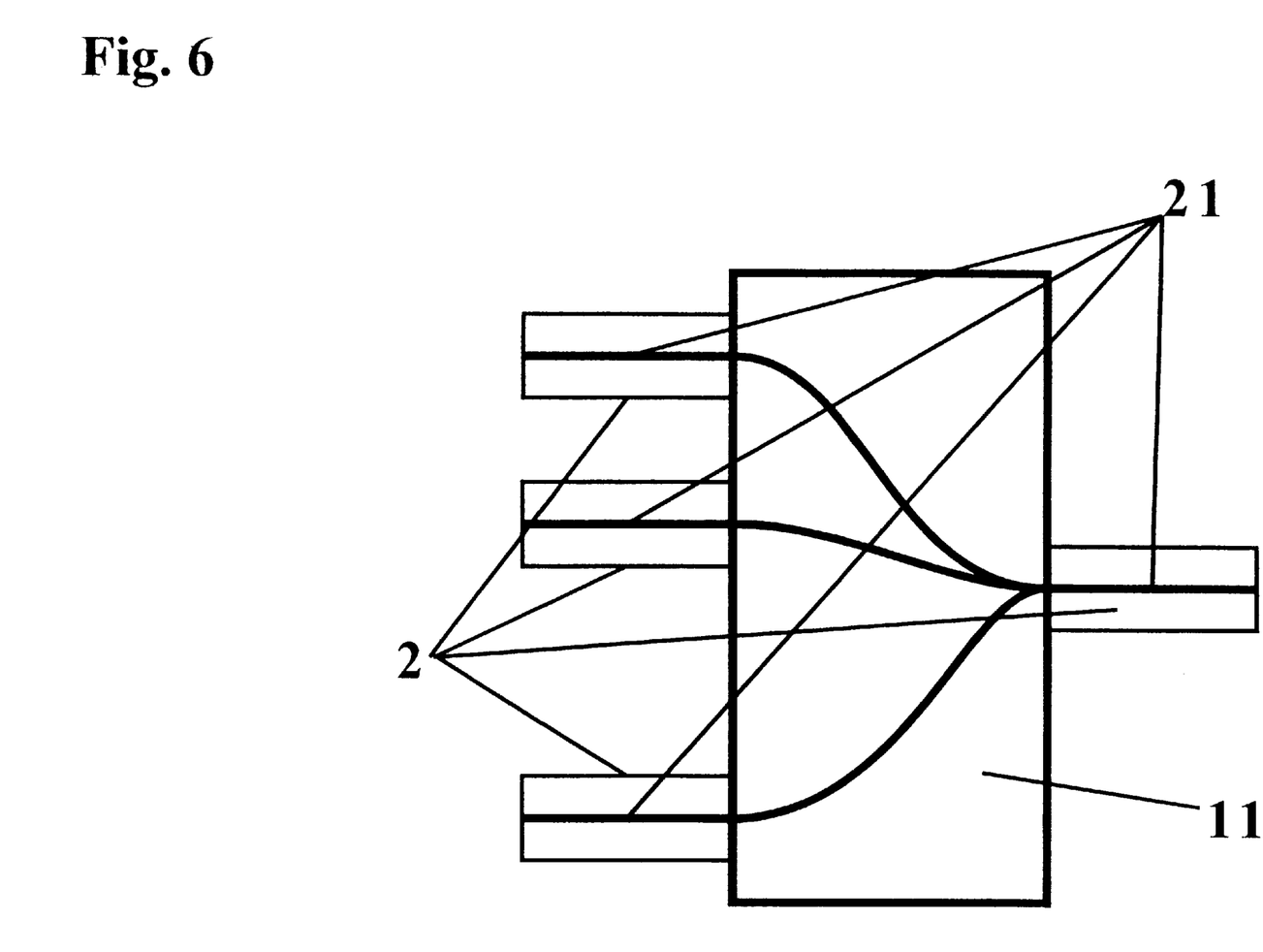
FIG. 6 is a longitudinal sectional view through a housing wall in which electrical traces are led from one level to different levels.

FIG. 6 shows three electrical traces 21, which are led from the same level in the housing interior (on the right) to different levels outside the housing (on the left). For this purpose, the flexible circuit 2 is separated in the housing wall 11 to be injection-molded, so that the individual electrical traces 21 can be led to different levels with respect to the outer side of the housing. To be able to contact a circuit carrier in a simple way, it is often necessary for the electrical traces to be on the same level.

Figure 7:
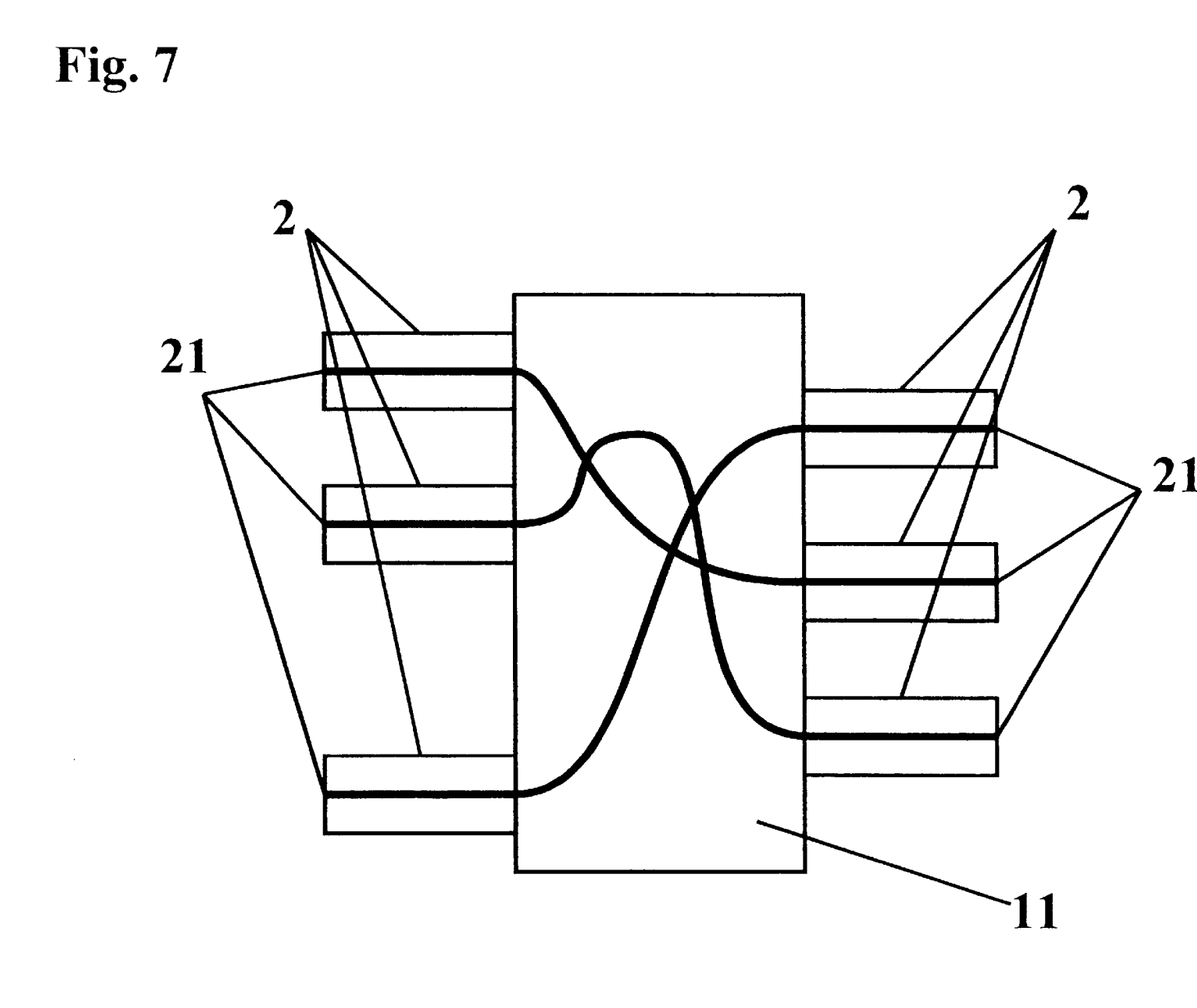
FIG. 7 is a cross sectional view through a housing wall in which electrical traces are split up from one level to different levels.

In FIG. 7, a horizontal cross section through a housing wall 11 is shown and is represented in a view from below from the housing opening 13. In the inner side of the housing (on the right) there are a plurality of flexible circuits 2, which respectively cover an electrical trace 21, on the same level with respect to a circuit carrier in the interior of the housing, but arranged offset (horizontally) with respect to one another. The electrical traces cross one another in the housing wall 11, so as to be arranged in a desired sequence on the outer side of the housing (on the left). In this example, the electrical traces on the outer side of the housing are arranged at different vertical levels.

Figure 8:
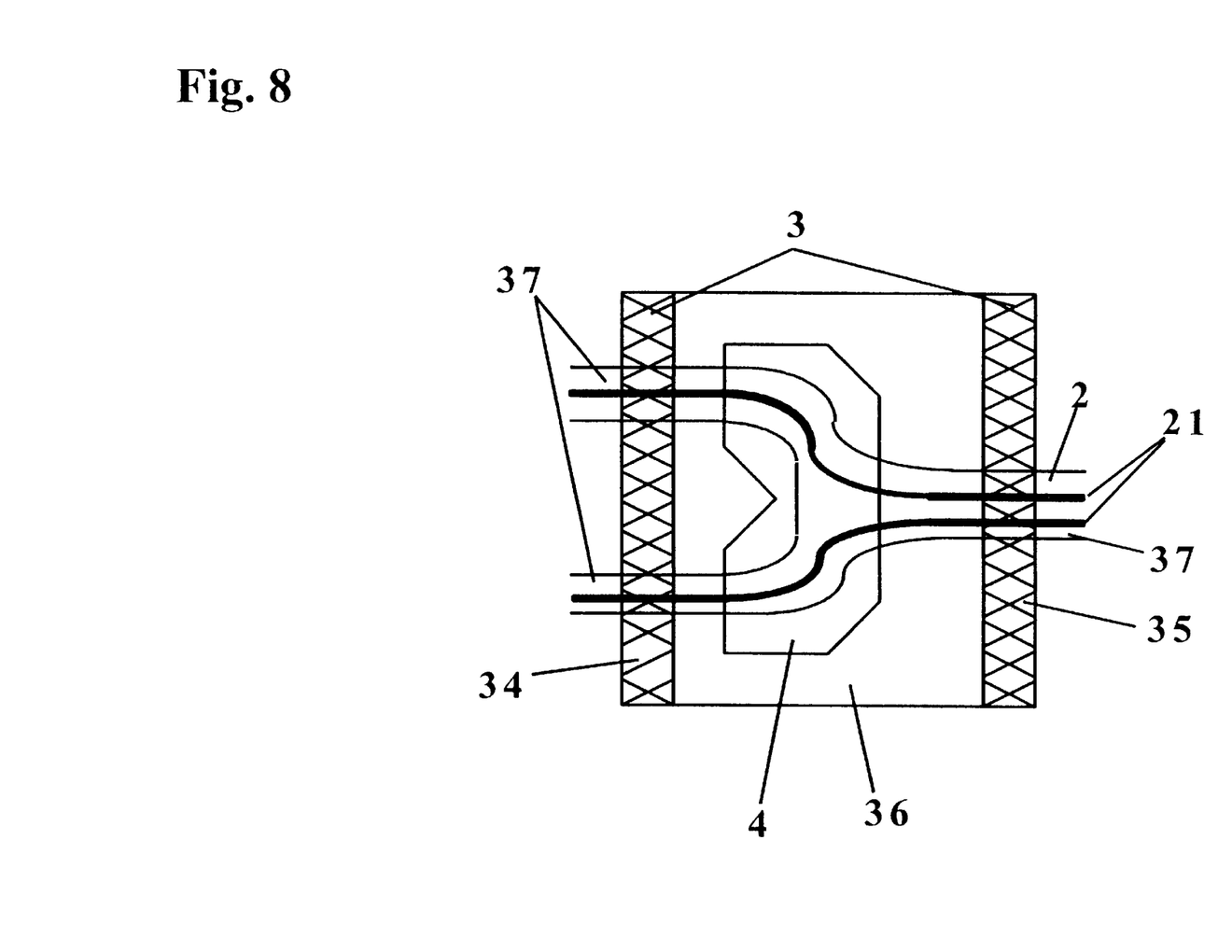
FIG. 8 is a view from above onto an injection mold half.

FIG. 8 shows one half of a two-part injection mold 3, onto which a flexible circuit 2 partially encapsulated in plastic has been placed. Although this is not shown, the injection mold forms a closed, hollow ring, into which plastic is injected. The ring is formed by a closed, peripheral outer wall 34 and a closed, peripheral inner wall 35.

An injection molding 4 is formed by encapsulating in plastic a portion of the flexible circuit 2 which will later lie within the housing wall 11. In particular, the flexible circuit 2 is encapsulated in plastic at the points at which electrical traces 21 and the flexible circuit separate or an electrical trace 21 branches off. The injection molding 4 prevents the flexible circuit 2 from tearing during injection-molding of the housing wall 11. At the same time, the injection molding 4 can be used in the fixing of the flexible circuit 2 by the injection mold.

Figure 9:
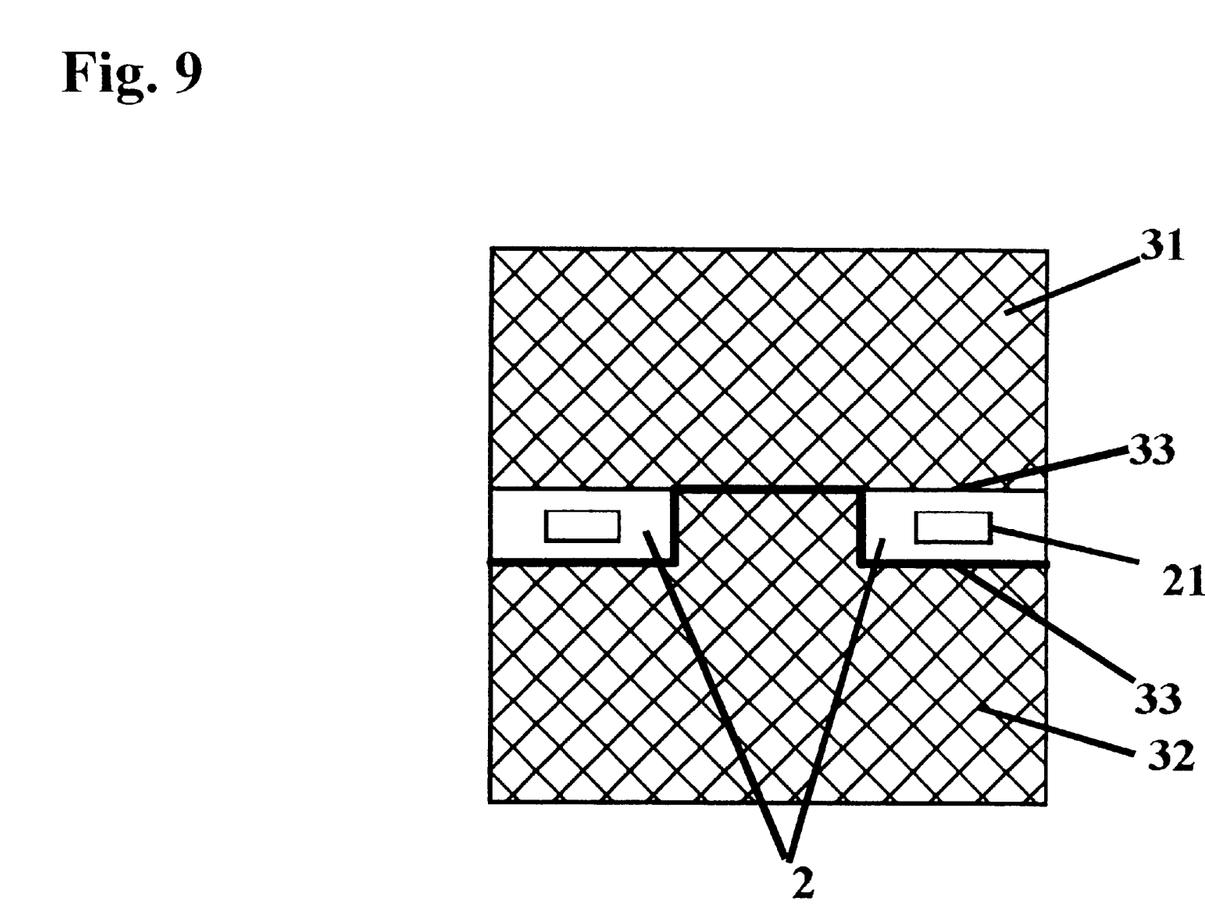
FIG. 9 is a front view of the injection mold half of FIG. 8 together with the second half.

FIG. 9 shows a front view of the injection mold 3 after the second half 31 of the injection mold has been placed onto the first half 32. Consequently, the flexible circuit 2 is mechanically fixed outside the housing wall to be injection-molded, between the lower part 32 and the upper part 31 of the injection mold 3. The contact surfaces 33 of the halves 32 and 31 of the injection mold rest on the flexible circuit 2. At points at which there is no flexible circuit, the halves lie one upon the other, as is shown in the intermediate space between the branched arms of the flexible circuit.

During the injection-molding of the plastic housing 1, a cavity 36 in the injection mold 3 is filled with molten plastic and consequently the flexible circuit 2 is also encapsulated.

Splitting up of electrical traces takes place in each case by an electrical trace which is surrounded by a flexible circuit being fixed at a fixing point 31 of the inner wall 35 of the injection mold 3 and at a fixing point 31, chosen in any desired relationship with the first fixing point, on the outer wall 34 of the injection mold. The electrical traces 21 may cross one another within the injection mold in the cavity 36 and later within the housing wall 11.

If the electrical traces are arranged at different levels, as shown in FIG. 6, this can take place by means of a step-like structure of the contact surfaces 33 of the injection mold. The electrical traces 21 then lie against the inner wall 35 and/or against the outer wall 34 of the injection mold 3 such that they are distributed over a number of steps and consequently over a number of levels.

We claim:

1. A sealed electrical line penetration, comprising:
   a housing wall made of plastic enclosing a cavity;
   a flexible circuit penetrating said housing wall, said flexible circuit having a plurality of electrical traces embedded therein and electrical contact points on either side of said housing wall;
   said flexible circuit being injection molded into said housing wall, and said electrical traces of said flexible circuit being led to different levels in said housing wall.

2. The sealed electrical line penetration according to claim 1, wherein said flexible circuit is a flexible film with a top film and a base film, said electrical traces being embedded between said top film and said base film.

3. The sealed electrical line penetration according to claim 2, wherein said top film and said base film are physically bonded to said housing wall.

4. The sealed electrical line penetration according to claim 2, wherein said top film and said base film are chemically bonded to said housing wall.

5. The sealed electrical line penetration according to claim 2, wherein said top film and said base film are physically and chemically bonded to said housing wall.

6. The sealed electrical line penetration according to claim 1, wherein said flexible circuit is one of a plurality of flexible circuits molded into said housing wall and split up in said housing wall to different levels.

7. A sealed electrical line penetration, comprising:
   a housing with a housing wall made of plastic, said housing enclosing a cavity;
   a flexible circuit penetrating said housing wall, said flexible circuit having a plurality of electrical traces embedded therein and electrical contact points on either side of said housing wall;
   said flexible circuit being encapsulated by said housing wall, and said flexible circuit being injection molded into said housing substantially around a periphery thereof.

8. The sealed electrical line penetration according to claim 1, wherein the flexible circuit has clearances through which a plastic can flow during injection molding.

* * * * *